United States Patent
Hirohata

(10) Patent No.: US 9,548,634 B2
(45) Date of Patent: Jan. 17, 2017

(54) SPIN MOTOR AND ROTARY MEMBER

(71) Applicants: Japan Science and Technology Agency, Kawaguchi-shi, Saitama (JP); The University of York, Heslington, York, North Yorkshire (GB)

(72) Inventor: Atsufumi Hirohata, Heslington (GB)

(73) Assignees: Japan Science and Technology Agency, Kawaguch-shi, Saitama (JP); The University of York, York (GB)

( * ) Notice: Subject to any disclaimer, the term of this patent is extended or adjusted under 35 U.S.C. 154(b) by 179 days.

(21) Appl. No.: 14/420,516

(22) PCT Filed: Jul. 25, 2013

(86) PCT No.: PCT/JP2013/070216
§ 371 (c)(1),
(2) Date: Feb. 9, 2015

(87) PCT Pub. No.: WO2014/024697
PCT Pub. Date: Feb. 13, 2014

(65) Prior Publication Data
US 2015/0229169 A1    Aug. 13, 2015

(30) Foreign Application Priority Data
Aug. 9, 2012 (JP) ................................. 2012-177339

(51) Int. Cl.
*H02N 1/00* (2006.01)
*H02N 15/00* (2006.01)
(Continued)

(52) U.S. Cl.
CPC ........... *H02K 1/27* (2013.01); *H01L 29/66984* (2013.01); *H02K 1/12* (2013.01); *H02N 1/002* (2013.01); *H02N 15/00* (2013.01)

(58) Field of Classification Search
USPC ............. 310/300, 308, 309, 156.01; 365/158
See application file for complete search history.

(56) References Cited

U.S. PATENT DOCUMENTS

2010/0097063 A1   4/2010  Ando et al.
2010/0157662 A1*  6/2010  Ono ..................... B82Y 10/00
                                                365/158

FOREIGN PATENT DOCUMENTS

EP        0817363       1/1998
JP    05300758 A    * 11/1993
(Continued)

OTHER PUBLICATIONS

Machine Translation, USUI, JA 05300758 A, Nov. 12, 1993.*
(Continued)

*Primary Examiner* — Thomas Truong
(74) *Attorney, Agent, or Firm* — Amster, Rothstein & Ebenstein, LLP

(57) ABSTRACT

A spin rotary member includes a substrate, a spin injector made of a ferromagnetic material magnetized in a substrate in-plane direction, and provided on the substrate, a spin rotor made of a ferromagnetic material having a magnetic moment rotatable in the substrate in-plane direction, and provided on the substrate, being separated from the spin injector, a channel part made of a non-magnetic material, arranged between the spin injector and the spin rotor, and bonded with the spin injector and the spin rotor directly or through an insulating layer, and a spin rotation control part configured to control a rotation direction of spin of the channel part.

10 Claims, 4 Drawing Sheets

(51) Int. Cl.
  *H02K 1/27*   (2006.01)
  *H01L 29/66*  (2006.01)
  *H02K 1/12*   (2006.01)

(56) References Cited

FOREIGN PATENT DOCUMENTS

| | | |
|---|---|---|
| JP | 2001-358379 A | 12/2001 |
| JP | 2003-092412 A | 3/2003 |
| JP | 2006-345638 A | 12/2006 |
| JP | 2007-069325 A | 3/2007 |
| TW | 479399 B | 3/2002 |
| WO | 02/23638 A2 | 3/2002 |
| WO | 2008/123023 A1 | 10/2008 |

OTHER PUBLICATIONS

International Search Report received for PCT Patent Application No. PCT/JP2013/070216 mailed on Sep. 3, 2013, 2 pages.
International Bureau, "International Preliminary Report on Patentability", received for PCT Patent Application No. PCT/JP2013/070216, which is a US counterpart of U.S. Appl. No. 14/420,516 mailed on Feb. 19, 2015, 7 pages.
Supplementary European Search Report, mailed Jul. 13, 2015, for PCT/JP2013070216, filed Jul. 25, 2013.
Taiwan Patent Office, Office Action and Search Report, issued in TW Patent Application No. 102128253, which is a Taiwan counterpart of U.S. Appl. No. 14/420,516 issued on Nov. 17, 2015, 3 pages (2 pages of Office Action and 1 page of Search Report).
H. Dery et al., "Spintronics for electrical measurement of light polarization," Journal of Applied Physics, 100, 063713-1-063713-7 (Sep. 1, 2006).

\* cited by examiner

SPIN MOTOR AND ROTARY MEMBER

This application is a National Stage entry under 35 U.S.C. 371 of International Patent Application No. PCT/JP2013/070216, filed on Jul. 25, 2013, which claims the benefit of and priority to Japanese Patent Application No. P2012-177339, filed on Aug. 9, 2012, the entire contents of each of which are incorporated by reference herein.

TECHNICAL FIELD

The present invention relates to a spin motor and a spin rotary member.

BACKGROUND ART

Conventionally, a nanoscale small motor is known as a motor (for example, see Patent Literatures 1 and 2). A motor described in Patent Literature 1 includes a rotor including magnet, and small coils surrounding the rotor from four directions, and is driven using electromagnetic induction. A motor described in Patent Literature 2 includes a rotor made of a non-magnetic material to which an electrode is connected, and is driven using gyromagnetic effect.

CITATION LIST

Patent Literature

Patent Literature 1: Japanese Patent Application Laid-Open No. 2007-069325
Patent Literature 2: Japanese Patent Application Laid-Open No. 2006-345638

SUMMARY OF INVENTION

Technical Problem

However, with regard to the motor described in Patent Literature 1, it is necessary to assemble the rotor, adjusting an arrangement relation to surround the rotor with a plurality of coils, and thus manufacturing may become difficult when achieving further downsizing. Further, with regard to the motor described in Patent Literature 2, it is necessary to apply a current to the rotor itself, and thus a special structure to be coupled with the electrode in a state where rotating of the rotor is secured is necessary. Therefore, in the present technical field, a motor with a simple structure and a member used for the motor are desired.

Solution to Problem

A spin rotary member according to one aspect of the present invention includes: a substrate; a spin injector made of a ferromagnetic material magnetized in a substrate in-plane direction, and provided on the substrate; a disk-like spin rotor made of a ferromagnetic material having a magnetic moment rotatable in the substrate in-plane direction, and provided on the substrate, being separated from the spin injector; a channel part made of a non-magnetic material, arranged between the spin injector and the spin rotor, and bonded with the spin injector and the spin rotor directly or through an insulating layer; and a spin rotation control part configured to control a rotation direction of spin of the channel part.

With such a configuration, when a current or a voltage is applied to the spin injector made of a ferromagnetic material and the channel part made of a non-magnetic material, for example, a spin current is caused in the channel part toward the spin rotor made of a ferromagnetic material. Spin flowing in the channel part functions as a spin-transfer torque with respect to the magnetic moment of the spin rotor. At this time, the direction of spin flowing in the channel part can be controlled by the spin rotation control part, and thus the magnetic moment of the spin rotor can be rotated. Therefore, the spin rotary member can be realized with a simple structure. Further, by use of the spin rotary member, a motor with a simple structure can be configured, for example.

In an embodiment, the spin rotation control part may be bonded with the channel part directly or through an insulating layer, and may apply a voltage to the channel part. Further, the spin rotation control part may irradiate the channel part with the circularly polarized light. Further, the spin rotation control part may change a voltage value to be applied to the spin injector. With such a configuration, a spin current flowing in the channel part can be appropriately controlled.

In an embodiment, the channel part may be formed of a semiconductor material. With such a configuration, the channel part is irradiated with the circularly polarized light, whereby the direction of spin can be controlled. Further, spin control through spin-orbit interaction can be performed.

In an embodiment, the channel part may include a two-dimensional electron gas layer. With such a configuration, spin is supplied by the two-dimensional electron gas layer. Therefore, propagation of angular momentum of spin in the channel part can be efficiently performed.

In an embodiment, the channel part is a linear member arranged such that an axial direction faces an in-plane direction, and the diameter of the spin rotor may be smaller than a line width of the channel part. With such a configuration, propagation of angular momentum of spin with respect to the spin rotor can be efficiently performed.

A spin motor according to another aspect of the present invention includes a substrate, a spin injector made of a ferromagnetic material magnetized in a substrate in-plane direction, and provided on the substrate, a spin rotor made of a ferromagnetic material having a magnetic moment rotatable in the substrate in-plane direction, and provided on the substrate, being separated from the spin injector, a channel part made of a non-magnetic material, arranged between the spin injector and the spin rotor, and bonded with the spin injector and the spin rotor directly or through an insulating layer, a spin rotation control part configured to control a rotation direction of spin of the channel part, and a motor rotor made of a ferromagnetic material, arranged to face and to be separated from the spin rotor, and configured to be rotated following the magnetic moment of the spin rotor.

With such a configuration, when the magnetic moment of the spin motor is rotated, the motor rotor made of a ferromagnetic material, and arranged to face the spin rotor can be rotated following the rotation of the magnetic moment of the spin rotor. Therefore, the spin motor can be realized with a simple structure in which the spin rotor and the motor rotor are arranged to face each other.

In an embodiment, the spin rotor may have a disk shape, and the motor rotor may be arranged such that a rotation axis is perpendicular to the substrate. When the spin rotor is a disk shape, magnetic anisotropy of the spin rotor in the substrate in-plane direction can be made uniform. Therefore, rotation of the magnetic moment of the spin rotor in the substrate in-plane direction can be easily controlled.

In an embodiment, the channel part may be formed on the substrate, the spin injector and the spin rotor may be formed on the channel part, and the motor rotor may be arranged to be separated above the spin rotor. With such a configuration, the spin motor can be easily produced.

Advantageous Effects of Invention

As described above, according to various aspects and embodiments of the present invention, a motor with a simple structure and a member used for the motor can be provided.

DESCRIPTION OF EMBODIMENTS

Hereinafter, embodiments of the present invention will be specifically described with reference to the appended drawings. Note that the same elements are denoted with the same reference sign in the description of the drawings, and overlapping description is omitted. Further, dimension ratios of the drawings do not necessarily accord with the description.

Figure 1:
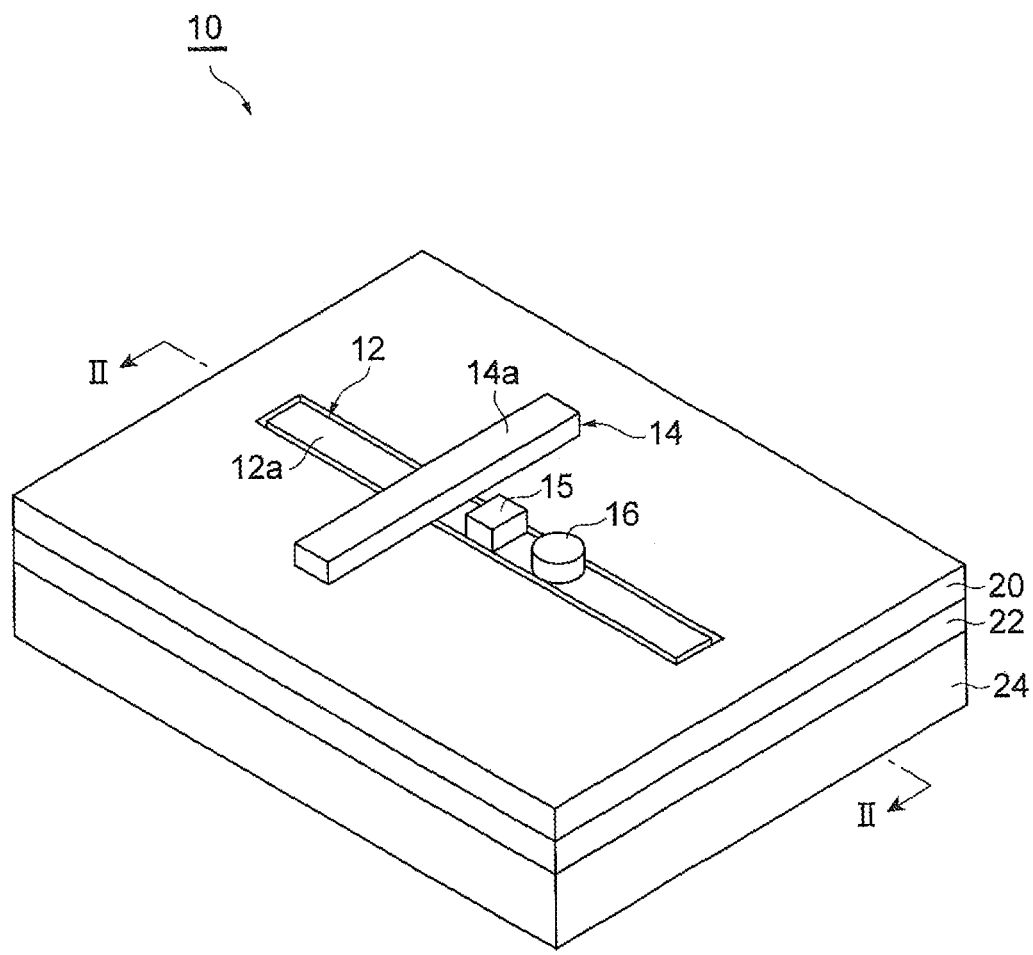
FIG. 1 is a perspective view of a spin rotary member according to an embodiment.
Figure 2:
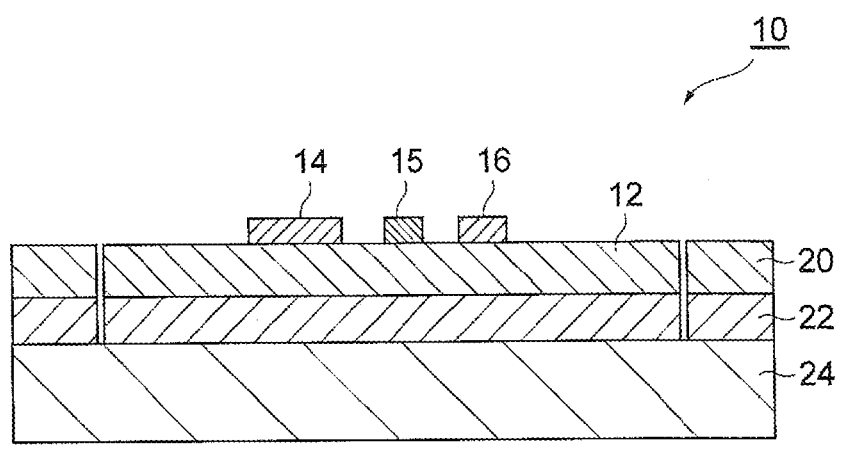
FIG. 2 is a cross-sectional view along an II-II line of FIG. 1.

A spin motor according to the present embodiment is a spin motor that is an application of a so-called spin valve structure, and is favorably employed as a nanoscale spin motor, for example. FIG. 1 is a perspective view of a spin rotary member used for the spin motor according to the embodiment. FIG. 2 is a cross-sectional view along an II-II line of FIG. 1.

As illustrated in FIG. 1, a spin rotary member 10 includes, for example, a channel part 12, a spin injector 14, a spin rotation control part 15, and a spin rotor 16. Here, an in-plane spin valve structure is formed, in which the spin injector 14 made of a ferromagnetic material and the spin rotor 16 made of a ferromagnetic material are bridged by the channel part 12 made of a non-magnetic material. The spin injector 14 and the spin rotor 16 can be formed of Fe, NiFe, or the like. The channel part 12 can be formed of a semiconductor material such as Si or gallium arsenide (GaAs) or a non-magnetic metal such as Ag or Cu, or the like. Hereinafter, a case in which the channel part 12 is formed of a semiconductor material will be described.

As illustrated in FIGS. 1 and 2, the channel part 12 is arranged on a substrate 24. As the substrate 24, a semiconductor substrate is used, for example. The channel part 12 is a linear member, and is arranged such that an axial direction thereof faces an in-plane direction. The channel part 12 is formed such that a semiconductor layer 20 laminated on the substrate 24 is machined in a mesa manner. The line width of the channel part 12 is 10 μm or less, for example. Further, the line width of the channel part 12 may be 0.05 μm or more, for example. Note that, when a two-dimensional electron gas layer 22 is formed between the substrate 24 and the semiconductor layer 20, the channel part 12 may be formed such that the two-dimensional electron gas layer 22 and the semiconductor layer 20 are machined in a mesa manner. For example, when a GaAs substrate is used as the substrate 24, and the semiconductor layer 20 is formed such that the substrate 24 is doped with electrons, the two-dimensional electron gas layer 22 is formed between the semiconductor layer 20 and the substrate 24.

The spin injector 14 is provided on the substrate 24. The spin injector 14 is a linear member, arranged such that an axial direction faces the in-plane direction, and magnetized in the in-plane direction. Note that, here, the spin injector 14 is arranged on the channel part 12. The spin injector 14 is arranged to intersect with the channel part 12. Therefore, the spin injector 14 and the channel part 12 are in contact with each other (are directly bonded). An area where the spin injector 14 and the channel part 12 intersect with each other is a spin injection area (spin injection position). The line width of the spin injector 14 is 10 μm or less, for example. Further, the line width of the spin injector 14 may be 0.05 μm or more, for example.

The spin rotor 16 is provided on the substrate 24, being separated from the spin injector 14. The spin rotor is a disk member, and is formed such that a magnetic moment faces a substrate in-plane direction. Note that the disk member means a member having a shape where a horizontal cross section does not form an acute angle portion. The disk member may be a disk-shaped (dot-shaped) member with a small diameter, or a conical member. Further, examples of the disk member include not only a plate-like member with a circular horizontal cross section, but also a member with an elliptical horizontal cross section, and a member with a polygonal horizontal cross section and an angle of a corner of nearly 180 degrees, which is an extremely large polygon. Here, the spin rotor 16 is arranged on the channel part 12. The spin rotor 16 is in contact with (is directly bonded with) the channel part 12. Here, the spin rotor 16 is formed such that the diameter becomes smaller than the line width of the channel part 12. The diameter of the spin rotor 16 is 10 μm or less, for example. Further, the diameter of the spin rotor 16 may be 0.05 μm or more, for example.

As described above, the in-plane spin valve structure in which the channel part 12 is arranged between the spin injector 14 and the spin rotor 16 is formed. A terminal part 14a for current or voltage application is formed at one end portion of the spin injector 14, and a terminal part 12a for current or voltage application is formed at one end portion (an end portion closer to the spin injector 14, of both end portions) of the channel part 12.

The spin rotation control part 15 includes a voltage control part and a voltage application terminal, for example. The spin rotation control part 15 is connected to the channel part 12. For example, the spin rotation control part 15 is directly connected with an area on the channel part 12, the area being positioned between the spin injector 14 and the spin rotor 16. The spin rotation control part 15 is configured to be capable of applying an electric field or a magnetic field to the channel part 12 in order to control a rotation direction of spin of the channel part 12. The spin rotation control part 15 has an approximately rectangular parallelepiped shape, and the width in a direction perpendicular to a longitudinal direction of the channel part 12 is 10 μm or less, for example. Further, the width in the direction perpendicular to the longitudinal direction of the channel part 12 may be 0.1 μm or more, for example. Note that there the spin rotor 16 is formed such that the width in the direction perpendicular to the longitudinal direction of the channel part 12 becomes the line width of the channel part 12 or less.

Figure 3:
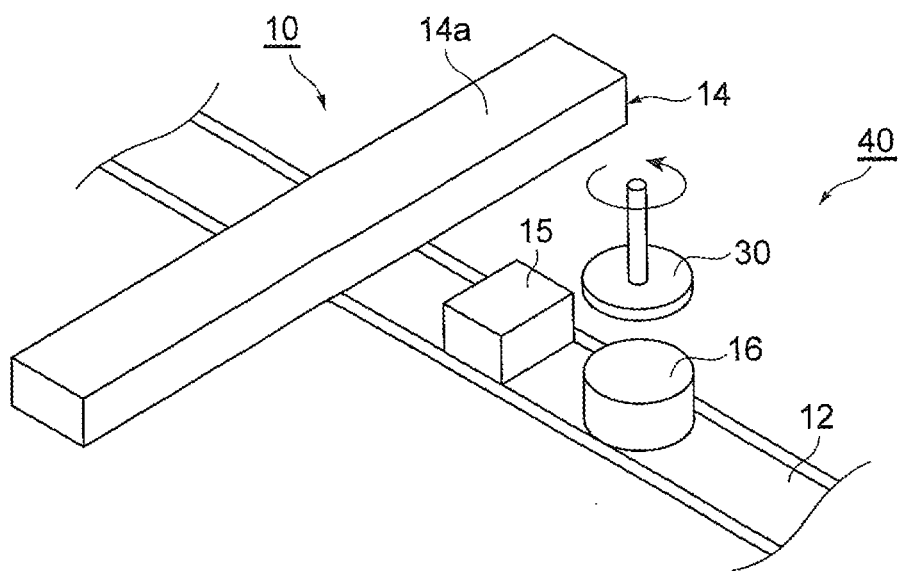
FIG. 3 is a perspective view of a spin motor according to an embodiment.

FIG. 3 is a perspective view illustrating a spin motor according to an embodiment. As illustrated in FIG. 3, a spin motor 40 includes a spin rotary member 10 and a motor rotor 30. The motor rotor 30 is formed of a ferromagnetic material, and is arranged to face and to be separated above a spin rotor 16. The motor rotor 30 may just be arranged in a range where a stray magnetic field of the spin rotor 16 is transmitted, and is arranged in a range of several tens of nm or less from the spin rotor 16, for example. That is, the motor rotor 30 is arranged in a rotatable position, following the magnetic moment of the spin rotor 16. The motor rotor 30 has an approximately disk-like shape, and is arranged such that a rotation axis thereof is perpendicular to the substrate 24. Note that the shape of the motor rotor 30 is not limited to the approximately disk-like shape, and may be a bar-like member, or the like. A bar-like member that transmits a rotary motion of the motor rotor 30 is connected to the motor rotor 30. The diameter of the motor rotor 30 is 10 μm or less, for example. Further, the diameter of the motor rotor 30 may be 0.1 μm or more, for example.

Figure 4:
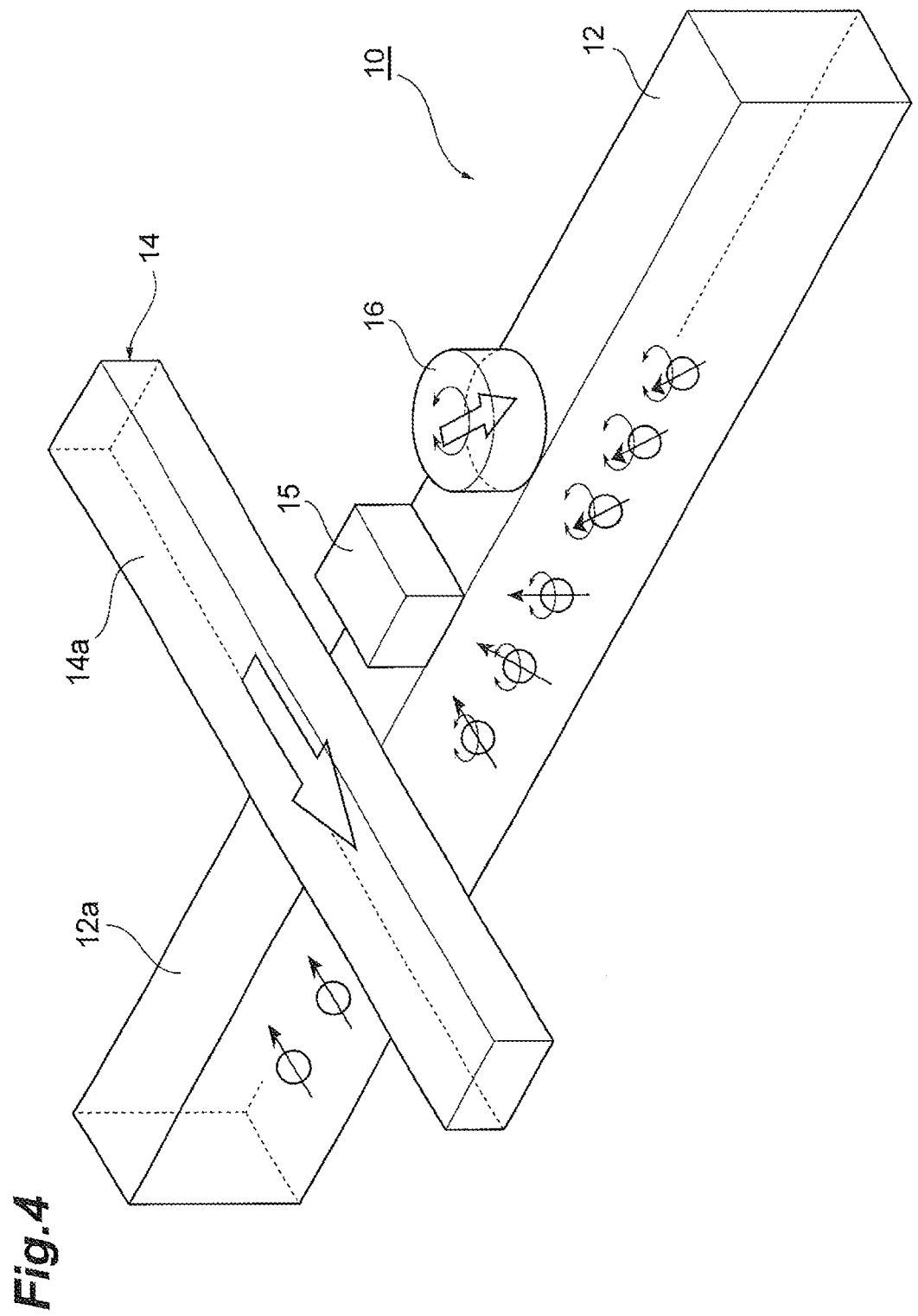
FIG. 4 is a schematic diagram for describing an operation principal of a spin rotary member according to an embodiment.

The spin rotary member 10 and the motor rotor 30 having the above-described configuration are operated as follows. FIG. 4 is a schematic diagram for describing an operation principal of the spin motor 40 of an embodiment. First, a current is applied to between the terminal part 14a of the spin injector 14 and the terminal part 12a of the channel part 12. Accordingly, spin that is antiparallel to a magnetization direction of the spin injector 14 is injected to the channel part 12, as illustrated in FIG. 4. The spin injected to the channel part 12 is diffused to the both end portions of the channel part 12. At this time, spin antiparallel to the diffused spin flows from the spin rotor 16 side to the spin injector 14 side. Therefore, a spin current without charges is generated from the spin injector 14 side to the spin rotor 16 side. The spin flowing in the channel part 12 performs precession due to spin-orbit interaction, and the spin-orbit interaction is controlled by an electric field by a voltage applied by the spin rotation control part 15. That is, the direction of spin flowing in the channel part 12 is changed by the applied voltage of the spin rotation control part 15. Here, the direction of spin is gradually changed in the substrate in-plane direction by $\Delta\theta$ according to time. At this time, a fixed value may be set as a rotation angle. For example, it may be set to rotate by 10° ($\Delta\theta=10°$) per unit time. Alternatively, the rotation angle may be a variable value. The spin current reaching the spin rotor 16 has the direction of spin rotated by $\Delta\theta$ in the substrate in-plane direction in time series. The spin of the channel part 12 provides a spin-transfer torque to the magnetic moment of the spin rotor 16. Therefore, because the direction of spin of the spin current is rotated in time series, the magnetic moment of the spin rotor 16 is rotated. At this time, as illustrated in FIG. 3, the motor rotor 30 is rotated following the magnetic moment of the spin rotor 16. As described above, the rotation of the magnetic moment is converted into kinetic energy, whereby the spin motor can be driven as the spin motor 40. Further, for example, when as the horizontal cross section of the spin rotor 16, a shape having a difference in length of axes such as an ellipse is employed, the magnetic moment can easily face a major axis direction, and thus the direction of an initial magnetic moment can be controlled.

As described above, according to the spin rotary member 10 and the spin motor 40 of an embodiment, the motor rotor 30 is simply arranged to be separated above the spin rotor 16, whereby the rotation of the magnetic moment can be converted into the kinetic energy. That is, it is not necessary to assemble the motor rotor 30, adjusting the arrangement relation to surround the rotor with a plurality of coils, and it is not necessary to apply a current to the motor rotor 30 itself. Therefore, a motor with a simple structure can be achieved.

Further, according to the spin rotary member 10 and the spin motor 40 of an embodiment, the spin rotary member and the spin motor 40 can be manufactured by performing of laminating/etching on the substrate 24, and thus can be easily manufactured by conventional semiconductor technologies.

Further, while the spin diffusion length of a non-magnetic metal is about several hundreds of nm at room temperature, the spin diffusion length of a semiconductor is longer by more than one digit than the non-magnetic material. Therefore, the channel part 12 is formed of a semiconductor material, whereby the spin injector 14 and the spin rotor 16 can be formed, being separated from each other, compared with a case where another non-magnetic material is employed. Therefore, severe machining accuracy is not required in the manufacturing process, compared with the case where another non-magnetic material is employed, and the spin rotary member 10 can be easily produced.

Further, according to the spin rotary member 10 of an embodiment, the channel part 12 is formed of the two-dimensional electron gas layer 22 and the semiconductor layer 20, whereby spin is supplied from the two-dimensional electron gas layer 22. Therefore, propagation of angular momentum of the spin in the channel part 12 can be efficiently performed.

Further, according to the spin rotary member 10 of an embodiment, the spin rotor 16 is formed such that the width in the direction perpendicular to the longitudinal direction of the channel part 12 becomes the line width of the channel part 12 or less. Therefore, the angular momentum of the spin of the channel part 12 can be efficiently propagated to the spin rotor 16.

Further, according to the spin rotary member 10 of an embodiment, the current application terminal part 12a is formed at the end portion of the channel part 12, which is close to the spin injector 14. Therefore, a spin current without a flow of charges is generated, and the magnetic moment of the spin rotor 16 can be rotated. Therefore, generation of Joule heat can be suppressed, and thus the spin rotary member 10 can be stably operated.

The above-described embodiment illustrates an example of the spin rotary member and the spin motor according to the present invention. The present invention is not limited to the spin rotary member and the spin motor according to the embodiment, may be modified, or may be applied to other embodiments.

For example, in the above-described embodiment, an example in which the spin injector 14, the spin rotation control part 15, and the spin rotor 16 are directly bonded with the channel part 12 has been described. However, at least one of the spin injector 14, the spin rotation control part 15, and the spin rotor 16 may be bonded with the channel part 12 through an insulating layer. Even with such a configuration, the spin rotary member can function as the spin rotary member 10.

Further, in the above-described embodiment, an example in which the spin injector 14 and the spin rotor 16 are arranged above the channel part 12 has been described. However, the spin injector 14 and the spin rotor 16 may be arranged in any layout as long as at least a part of the spin injector 14 and the spin rotor 16 is in contact with the channel part 12. That is, the spin injector 14 and the spin rotor 16 may be arranged at a side portion of the channel part 12. Further, the spin rotor 16 may be the line width of the channel part 12 or more.

Further, in the above-described embodiment, an example of applying the current to the channel part 12 has been described as the spin rotation control part 15. However, another spin rotation control part may be employed. For example, an irradiation part that irradiates the channel part 12 with circularly polarized light may be employed as the spin rotation control part 15. Note that, in this case, the channel part 12 is formed of a semiconductor material. With such formation, it becomes possible to control the direction of spin using the circularly polarized light, and thus the number of components to be in contact with the channel part 12 can be decreased.

Further, a control part that changes a voltage value to be applied to the spin injector 14 may be employed as the spin rotation control part 15. A Schottky barrier is formed in an interface between a ferromagnetic material metal and a semiconductor, and when energy of electrons and a resonance level are matched, a large current flows. By change of the voltage value to be applied to the spin injector 14, the resonance level generated in the ferromagnetic material metal/semiconductor interface can be changed. Therefore, the direction of spin of the channel part 12 can be controlled with the applied voltage to the spin injector. With such formation, the number of components to be in contact with the channel part 12 can be decreased.

Further, in the above-described embodiment, an example in which a spin current without a flow of charges is generated by a so-called non-local technique and the spin rotor 16 is rotated has been described. However, the magnetic moment of the spin rotor 16 may be rotated such that the current application terminal part 21a is formed at the end portion of the channel part 12, which is close to the spin rotor 16, and the spin current with a flow of electrons is generated by a so-called local technique. In this case, current density can be made larger than that of the case of the non-local technique. Therefore, the spin torque can be made large. Therefore, the magnetic moment of the spin rotor 16 can be efficiently rotated.

Further, in the above-described embodiments, an example in which the motor rotor 30 is arranged to face and to be separated from the spin rotor 16 has been described. However, the spin rotor 16 and the motor rotor 30 are not limited to the case of being separated. For example, the spin rotor 16 and the motor rotor 30 may be connected through a bearing or the like. Even with such a configuration, the configuration can function as a spin motor.

In the above-described embodiments, the description has been given to include a case where the size of configuration members of the spin rotary member 10 and the spin motor 40 are micrometer-order members. However, the configuration members may be formed in nanometer-order size to form the nanoscale spin rotary member 10 and the spin motor 40.

INDUSTRIAL APPLICABILITY

The spin rotary member 10 has industrial applicability as follows. The spin rotary member 10, for example, can be used as a motor power source that drives a micro motor, like the spin motor 40 according to the above-described embodiments in the field of micro electro mechanical systems (MEMS), nano electro mechanical systems (NEMS), and the like. Further, the spin rotary member 10 and the spin motor 40 can be used as a device component or a motor of the electrical/electronic field, the medical related field, and the like.

Further, the spin rotary member 10 can be used as a component of a centrifugal separator (a component for centrifugal separator), for example. A centrifugal separator using the spin rotary member 10 may have a structure in which a plurality of spin rotors 16 having different numbers of rotations are arrayed, and a polymer biomaterial in which magnetic beads are embedded, and the like are rotated following a magnetic moment of the spin rotors 16, and separated by centrifugal force, for example.

Further, the spin rotary member 10 may be used as a component of an oscillator (a component for oscillator), for example. An oscillator using the spin rotary member 10, for example, may use magneto-resistance effect in which a current flows only when directions of two magnetic moments accord with each other. The oscillator may have a structure of performing oscillation according to the number of rotations of the spin rotor 16 by the magneto-resistance effect using the direction of the magnetic moment of a ferromagnetic material that is brought in contact with the spin rotor 16 through a non-magnetic material member, and the direction of the magnetic moment of the spin rotor 16.

REFERENCE SIGNS LIST

10 . . . Spin rotary member, 12 . . . Channel part, 14 . . . Spin injector, 15 . . . Spin rotation control part, 16 . . . Spin rotor, 24 . . . Substrate, 30 . . . Motor rotor, 40 . . . Spin motor

What is claimed is:

1. A spin rotary member, comprising:
a substrate;
a spin injector made of a ferromagnetic material magnetized in a substrate in-plane direction, and provided on the substrate;
a disk-like spin rotor made of a ferromagnetic material having a magnetic moment rotatable in the substrate in-plane direction, and provided on the substrate, being separated from the spin injector;
a channel part made of a non-magnetic material, arranged between the spin injector and the spin rotor, and bonded with the spin injector and the spin rotor directly or through an insulating layer; and
a spin rotation control part configured to control a rotation direction of spin of the channel part.

2. The spin rotary member according to claim 1, wherein the spin rotation control part is bonded with the channel part directly or through an insulating layer, and configured to apply a voltage to the channel part.

3. The spin rotary member according to claim 1, wherein the spin rotation control part irradiates the channel part with circularly polarized light.

4. The spin rotary member according to claim 1, wherein the spin rotation control part changes a voltage value to be applied to the spin injector.

5. The spin rotary member according to claim 1, wherein the channel part is formed of a semiconductor material.

6. The spin rotary member according to claim 1, wherein the channel part includes a two-dimensional electron gas layer.

7. The spin rotary member according to claim 1, wherein the channel part is a linear member arranged such that an axial direction faces an in-plane direction; and
a diameter of the spin rotor is smaller than a line width of the channel part.

8. A spin motor, comprising:
a substrate;
a spin injector made of a ferromagnetic material magnetized in a substrate in-plane direction, and provided on the substrate;
a spin rotor made of a ferromagnetic material having a magnetic moment rotatable in the substrate in-plane direction, and provided on the substrate, being separated from the spin injector;
a channel part made of a non-magnetic material, arranged between the spin injector and the spin rotor, and bonded with the spin injector and the spin rotor directly or through an insulating layer;
a spin rotation control part configured to control a rotation direction of spin of the channel part; and
a motor rotor made of a ferromagnetic material, arranged to face and to be separated from the spin rotor, and configured to be rotated following the magnetic moment of the spin rotor.

9. The spin motor according to claim 8, wherein
the spin rotor has a disk shape, and
the motor rotor is arranged such that a direction axis is perpendicular to the substrate.

10. The spin motor according to claim 8, wherein
the channel part is formed on the substrate;
the spin injector and the spin rotor are formed on the channel part; and
the motor rotor is arranged to be separated above the spin rotor.

* * * * *